United States Patent [19]

Bendall et al.

[11] Patent Number: 4,728,896

[45] Date of Patent: Mar. 1, 1988

[54] METHOD AND APPARATUS FOR OBTAINING N.M.R. SPECTRA AND COILS FOR USE THEREIN

[75] Inventors: Max R. Bendall, Burbank, Australia; Jamie M. McKendry, Kidlington, United Kingdom

[73] Assignee: Oxford Research Systems Limited, Abingdon, England

[21] Appl. No.: 759,881

[22] Filed: Jul. 29, 1985

[30] Foreign Application Priority Data

Jul. 31, 1984 [GB] United Kingdom ............... 8419466
Jun. 12, 1985 [GB] United Kingdom ............... 8514852

[51] Int. Cl.$^4$ .......................................... G01R 33/20
[52] U.S. Cl. ................................ 324/318; 324/322; 324/309; 335/299
[58] Field of Search ............... 324/318, 319, 320, 322, 324/307, 309, 311, 300; 335/299, 282; 336/223, 232

[56] References Cited

U.S. PATENT DOCUMENTS

| | | | |
|---|---|---|---|
| 3,603,871 | 9/1971 | Caunter et al. | 324/322 |
| 4,093,911 | 6/1978 | Hill et al. | 324/322 |
| 4,408,162 | 10/1983 | Egger | 324/318 |
| 4,467,282 | 8/1984 | Siebold | 324/309 |
| 4,590,427 | 5/1986 | Fukushima et al. | 324/318 |
| 4,620,155 | 10/1986 | Edelstein | 324/322 |
| 4,629,988 | 12/1986 | Bottomley | 324/309 |
| 4,641,097 | 2/1987 | Bottomley et al. | 324/318 |

FOREIGN PATENT DOCUMENTS

| | | | |
|---|---|---|---|
| 0655029 | 1/1963 | Canada | 324/311 |
| 2736744 | 2/1979 | Fed. Rep. of Germany | 335/299 |
| 0166457 | 12/1981 | Japan | 324/307 |

OTHER PUBLICATIONS

A. Haase, A New Method for the Decoupling of Multiple-Coil NMR Probes, J. of Mag. Res., 61, 1985, pp. 130–136.
E. Boskamp, Application of Surface Coils in MR Imaging, Medicamundi, vol. 29, No. 2, 1984.
M. Bendall, Portable NMR . . . Coils, Chemical Physics Letters, vol. 99, No. 4, Aug. 1983.
K. E. Kisman et al., "Coupling Scheme and Probe Damper for Pulsed . . . Probe", Rev. Sci. Inst., vol. 45, No. 9, Sep. 1974, pp. 1159–1163.
C. Lai et al. "Nuclear Magnetic . . . Imaging", Electromagnetic/78 Conference Record (1978) pp. 1–15.

*Primary Examiner*—Stewart J. Levy
*Assistant Examiner*—Scott M. Oldham
*Attorney, Agent, or Firm*—Cushman, Darby & Cushman

[57] ABSTRACT

Use of a switch at the end of a λ/4 cable inserted between the Rf coil and ground allows the coil to be tuned and detuned at will. This detune switch essentially eliminates coupling between adjacent coils permitting operation of multiple transmit coils at the same frequency. These switches have been employed to prove a previously proposed method of complete sensitive-volume localization using multiple Rf coils and depth pulse schemes. The example illustrated is the case of two coaxial coplanar surface coils. There are important uses in in-vivo spectroscopy.

11 Claims, 9 Drawing Figures

FIG. 2.b

METHOD AND APPARATUS FOR OBTAINING N.M.R. SPECTRA AND COILS FOR USE THEREIN

BACKGROUND OF THE INVENTION

This invention relates to nuclear magnetic resonance, and to coil assemblies for use in nuclear magnetic resonance.

In recent times, a great deal of effort has been concentrated in methods of obtaining N.M.R. spectra from localized regions in space. Such methods are of particular interest in in-vivo spectroscopy. A number of methods have been proposed, involving the application of field gradients, in combination with various sequences of Rf pulses. Such methods are in part successful, but suffer from the disadvantage that the resolution of the spectra obtained tends to be degraded by the use of the gradients.

A number of proposals have been made for localizing N.M.R. spectra, without the use of field gradients. For example, a method has been proposed by M.R. Bendall, (Chemical Physics Letters, 99, 310 (1983)), involving the use of a sequence of pulses of different amplitudes, and phases. For example, three pulses may be used before each signal acquisition, having pulse angles of $2\theta$, $\theta$, $2\theta$ respectively, and the experiment is repeated for various combinations of the phase of the first and third pulses, specifically, with phase shifts of 180° applied to the first pulse, and of 90°, 180°, and 270° applied to the third pulse. The signals obtained from the eight individual signal acquisitions carried out with the various combinations of these phase shifts are then averaged, and it is found that the signal obtained from various parts of the sensitive region of the receiving coil cancel, so that the actual signal sensed by the receiving coil is from a region localized in space.

The shorthand notation used to indicate the eight pulses in this sequence is as follows:

$$2\theta[\pm x]; \theta; (2\theta[\pm x, \pm y])n$$

where $\theta$ represents an arbitrary pulse angle of the Rf pulse used, $\pm$ indicates that the corresponding pulse is repeated with a 180° phase shift, and $\pm x \pm y$ indicates that the corresponding pulse is repeated with the three 90° phase shifts (ie four pulses in all). Pulse sequences of this kind are referred to herein as "depth" pulse sequences.

Various combinations of pulse angles and phase shifts are disclosed in the above papers, and in a number of other papers by Bendall and others.

In particular, the above paper by M. R. Bendall discloses that an improvement in spatial localization can be obtained by using separate Rf coils as transmitting and receiving antennae. A practical difficulty however with the use of separate coils is that, because of their close proximity to each other, the two coils couple together, and each interferes with the tuning of the other. Thus, some method of tuning and detuning the coils, separately from each other, must be devised.

Crossed diodes in series with the transmit coil, and in parallel with the receive coil, have been tried successfully as a method of tuning/detuning, but routine use of this method is presently prevented by the lack of a commercial supply of suitable non-magnetic diodes.

SUMMARY OF THE INVENTION

According to the first aspect of the invention, there is provided apparatus for obtaining an N.M.R. spectrum of a sample, which apparatus comprises means for generating a static magnetic field, a sample location space within the magnetic field for containing the sample, means for applying to the space an Rf field having a wavelength such as to cause perturbation of nuclear spins in the sample space in the presence of the magnetic field, and means for detecting the Rf signal induced in the sample as a consequence of the applied Rf field, the apparatus comprising at least two tuned Rf coils, at least one of the said Rf coils being connected to ground via switching means, whereby operation of the switching means causes the detuning of the said at least one coil. Either a transmit or receive coil, or both, or two or more receive or transmit coils, may be detuned by means of such a switching means.

A further aspect of the invention provides a method of detuning a radiofrequency coil during a pulsed nuclear magnetic resonance procedure of sample anaysis by operating a switch inserted between the radiofrequency coil and ground. The term "switch" is intended to encompass any means of substantially reducing the electrical current oscillating at the radiofrequency and flowing between the coil and ground.

In theory it is easier to shape the localized sensitive volume by applying part of a depth pulse sequence with one transmit coil and part with a second transmit coil. The principles of this method have been previously described (M. R. Bendall, Chemical Physics Letters, 99, 310 (1983).

The invention may be utilized to minimize coupling either between a transmitter coil and a receiver coil, or between two transmitter coils. In either case, what is required is that, during the application of pulses with one coil, the other coil is detuned. A possible method of doing this in accordance with the invention is to use a switch in each Rf circuit within the Rf probe. Thus, in accordance with the invention in its most general form, switching means are provided between at least one of the coils and ground, to detune the said coil from the other coil. In practice however the specification required of such a switch is very demanding. The switch must act quickly, say in a few milliseconds, and must function in a strong magnetic field. It must also withstand the high contact voltages generated during the Rf pulses. In a particularly preferred embodiment, the switching means takes the form of a switch at the end of a transmission line, for example a length of coaxial cable, having a length which is an integral number of quarter wavelengths (referred to hereinafter as a $\lambda/4$ cable). This enables the coil to be detuned by the use of a switch at a location remote from the probe, and this enables the use of a switch with a far less demanding specification.

A disadvantage with the methods of spatial localization used in pulse sequences previously proposed is that the sensitive volume to which they respond tends, because of the geometry of the coils, to be somewhat curved, for example to have a dished or banana shape. Most volumes which are of interest in practical NMR determinations are generally spherical, and accordingly it is desirable to be able to produce a coil assembly having more uniform field distribution in space than hitherto.

In accordance with a further aspect of the invention, we have discovered that, by providing Rf coils in at least two non-coplanar complimentary pairs, a sensitive volume can be produced which is less curved, and which is generally more useful for obtaining spectra from within solid bodies. Accordingly, in a further aspect of the invention, there is provided a coil assembly for use in an N.M.R. spectrometer, comprising at least two pairs of complimentary electrical coils, the coils of each pair being inclined with respect to each other in a "flower-petal" configuration, with coils corresponding to diametrically opposed petals connected together such that an electrical current applied thereto flows in the same direction about an axis passing through the said diametrically opposed coils. The number of pairs of coils is preferably 2, and these are preferably arranged symmetrically, ie. with their axes substantially at right angles to each other. The two coils of each pair are preferably also arranged to be at right angles to each other. This configuration results in particularly advantageous localization of the Rf field applied.

BRIEF DESCRIPTION OF THE DRAWINGS

The various aspects of the invention will now be illustrated in detail with reference to the accompanying drawings, in which.

DETAILED DESCRIPTION OF THE PREFERRED EXEMPLARY EMBODIMENT

Figure 1:
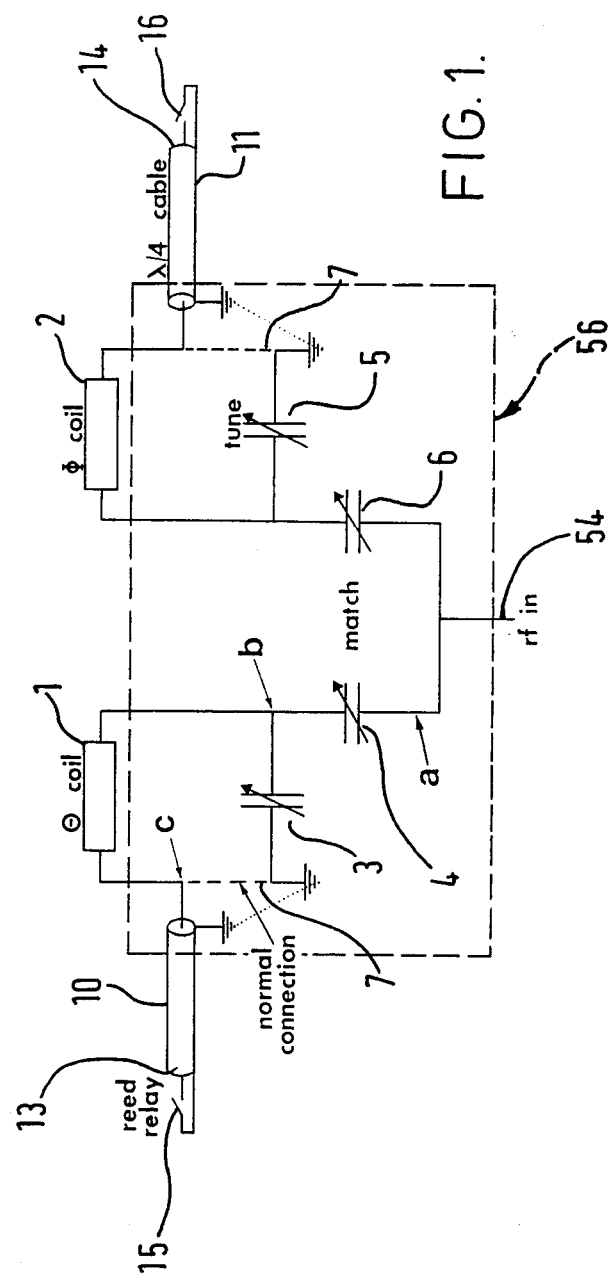
FIG. 1 is a schematic circuit diagram of a probe assembly.

Referring now to the drawings:

FIG. 1 is a generalized circuit diagram of an Rf probe in accordance with the invention, incorporating two Rf transmit coils, 1 and 2, for providing the so-called $\theta$ and $\Phi$ pulses, as referred in the publication by M. R. Bendall, referred to above.

$\theta$ coil 1 is provided with tuning capacitor 3, and matching capacitor 4. Similarly, $\Phi$ coil 2 is provided with tuning capacitor 5, and matching capacitor 6. In a conventional arrangement, each of the coils 1 and 2 would be connected directly to earth at one end, as shown by the dotted lines 7 and 8. In accordance with the invention however, the direct earth connections 7 are omitted, and instead the coils 1 and 2 are connected respectively to co-axial cables 10 and 11. The coils 1 and 2 are connected to the central conductor of the co-axial cables, the outer screen being connected to earth. The length of the co-axial cables 10 and 11 corresponds to approximately ¼ of the wavelength of the Rf frequency to be applied to the coils.

Figure 9:
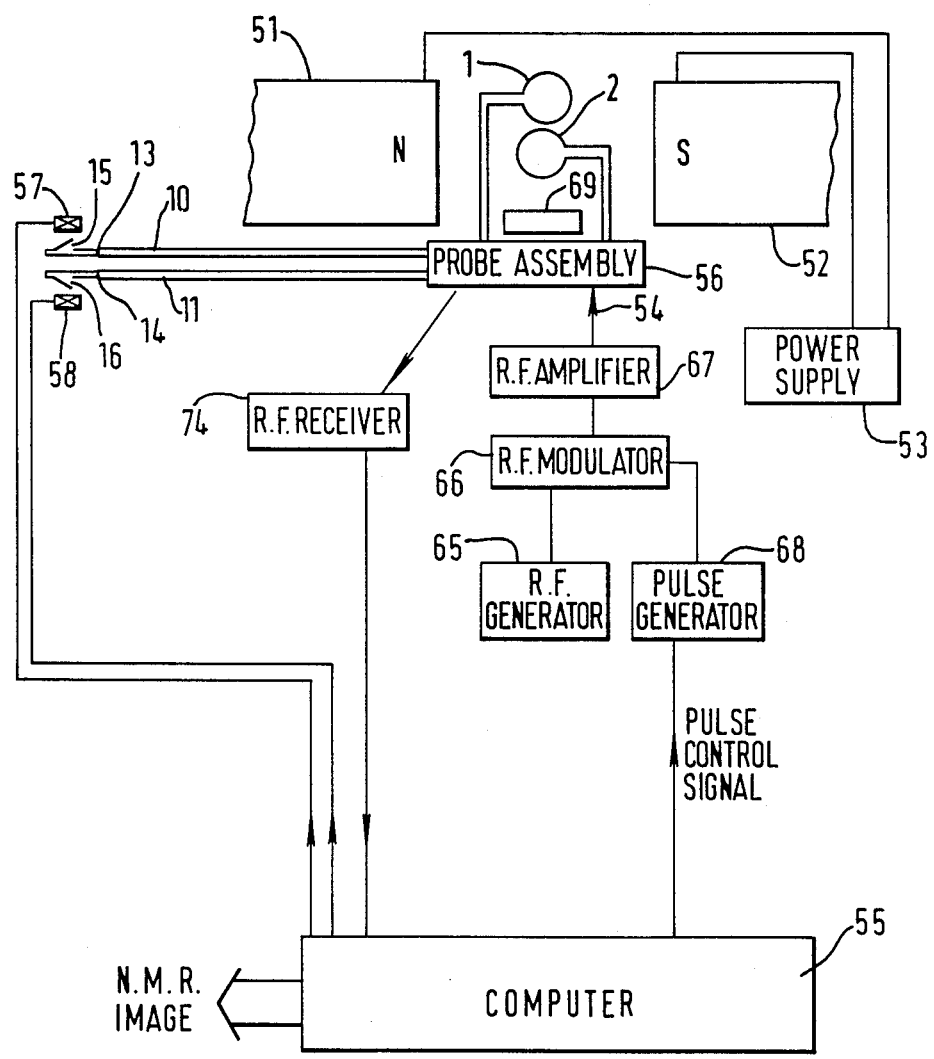
FIG. 9 is an overall schematic representation of apparatus in accordance with the invention

An overall schematic representation of apparatus in accordance with the invention, incorporating the probe assembly of FIG. 1, is illustrated in FIG. 9. FIG. 9 represents a conventional NMR instrument, having a magnet with north and south pole-pieces 51 and 52. The magnet may be a permanent magnet, or, preferably, is a superconducting magnet. The tuning and matching capacitors shown in FIG. 1 are contained within a screened probe assembly 56, illustrated by dotted line 56 in FIG. 1. Connected to probe assembly 56 are the $\theta$ coil 1, and $\Phi$ coil 2. Also terminating in probe assembly 56 are screened co-axial cables 10 and 11.

At the other ends 13, 14 of the co-axial cables 10 and 11, high speed switches 15 and 16 are provided between the central conductor and the screen of the co-axial cable. The switches 15 and 16 are, in practice, magnetic reed switches, and are operated at high speed by means of electrical coils 57 and 58 respectively. Electrical coils 57 and 58 are both driven by a computer, which also is responsible for producing the appropriate train of Rf pulses which are fed to the probe assembly.

The Rf pulses are generated by an Rf generator 65 coupled to a Rf modulator 66. Modulation of the radio frequency signal produced by the Rf generator 65 is controlled by a pulse generator 68, in turn controlled by computer 55. The modulated Rf signal is amplified by an Rf amplifier 67, and from there is fed to the probe assembly 56 by means of a connection 54. As shown in FIG. 1, probe assembly 56 contains the appropriate tuning and matching capacitors to enable both coils 1 and 2 to be separately tuned and matched.

An Rf receiver 74 of conventional form is also connected to the probe assembly 56, and receives the radio frequency signal resulting from the applied pulse sequence. The receiving antenna for the Rf receiver 74 may be one of the coils 1 or 2, or, preferably, is a further coil included in the probe assembly. The signal from the Rf receiver 74 is also passed to computer 55, where it is analyzed by appropriate means, to provide the desired NMR signal. A sample support 69 is provided to support the sample in the magnetic field. For example, if the apparatus is intended for carrying out an NMR experiment on a human body, the sample support 69 may be adapted to support a human patient with the appropriate part of the body between the pole pieces 51 and 52.

Because the switches 15 and 16 are spaced from the main spectrometer field by a distance corresponding to the length of the co-axial cables 10 and 11 (typically 1.5 m in the experiments described), no substantial interference by the switching coils with the main spectrometer field coil is experienced.

When the switches 15 and 16 are in the open condition, as illustrated in FIG. 1, the circuit is equivalent to direct connections between the coils 1 and 2, and earth. When the high speed switches 15 and 16 are in the closed position, they are equivalent to the breaking of the connection between the coils 1 and 2 and earth. Thus, by appropriate operations of the switches 15 and 16, either or both of the coils 1 and 2 may be brought into circuit.

To minimize interaction between the coils used for driving the switches 15 and 16, and the main magnetic field of the spectrometer, it is preferable to align the axis of the reed switches at right angles to the local component of the main magnetic field. In a preferred embodiment however, the switches 15 and 16, and associated coils, may be included within a magnetically shielded enclosure, for example a steel or mu-metal box.

The point of insertion of the λ/4 cable into the Rf circuit is critical. If inserted between the live Rf input and the matching capacitor (point a of FIG. 1), the Rf circuit is dematched when the relay is closed, rather than detuned, and the Rf coil would still couple with an adjacent coil. If inserted in the high voltage part of the circuit (point b of FIG. 1) the Q of the coil is dramatically decreased and the λ/4 cable or the relays would be likely to fail under pulse power.

When the point of connection of the λ/4 cables is as illustrated in FIG. 1, the Q of the coil is only slightly reduced, and when the relay is closed, point c is effectively open circuit, and the coil is effectively removed from taking any part in the overall circuit. Thus two coils θ and Φ can be connected to the same rf input as in FIG. 1 and used separately as transmit coils by opening the respective relays.

FIGS. 2a to 2d are schematic diagrams illustrating the intensity contours of signals obtained from a homogeneous sample (a 9 mm thick slice phantom), using a circuit as in FIG. 1. Two transmit coils 21 and 22 were utilized in a co-planar arrangement, the outer having a diameter of 70 mm, and the inner a diameter of 20 mm. In this arrangement, if not for the circuitry described above, the coils would be closely coupled. For example, having tuned and matched one coil to 32 MHz, it is impossible to introduce a second coil and tune and match it to 32 MHz. However, using the two λ/4 cables, and high speed switches, the interaction between the two coils is virtually eliminated. For example, with the switch for the coil 21 open (tuned) and the switch for the coil 22 closed (detuned), gross changes in the tuning and matching capacitance of the coil 22 change the tuning and matching of the coil 21 only to a very small degree, warranting the finest re-adjustments.

Figure 2A:
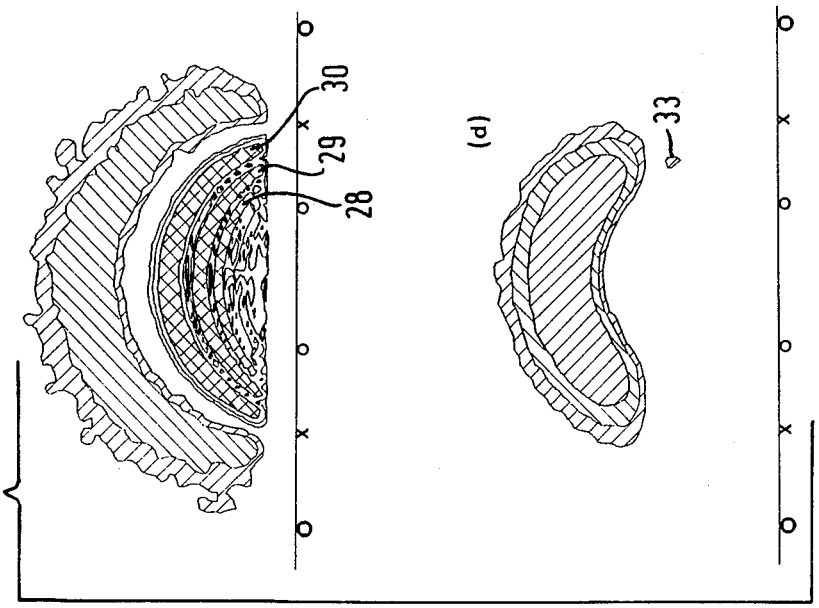
FIG. 2 represents $^{31}P$ images obtained using the probe assembly of FIG. 1.
Figure 2A:
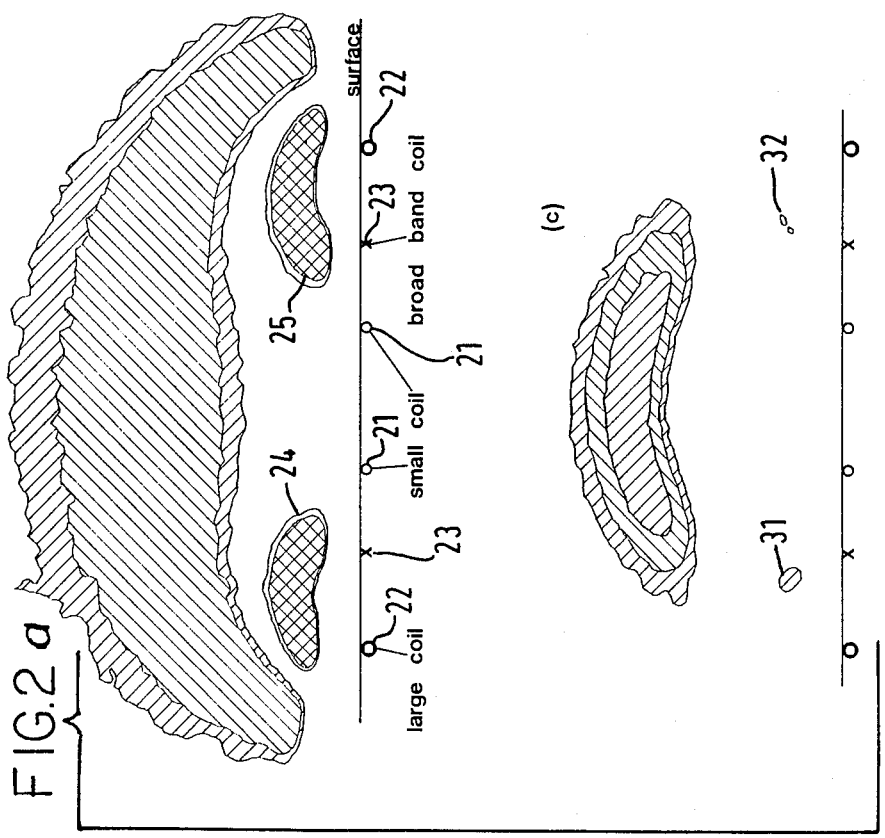

FIG. 2a represents the intensity contours obtained with pulse power applied using the large coil 22 only, with the small coil 21 detuned. The x-direction is taken to be the depth axis or coil axis. The smaller cross-hatched regions 24 and 25 of FIG. 2(a) correspond to θ angles close to 270° ("the 270° region"). The image is slightly distorted, curving away from the surface, as a result of magnetic field inhomogeneity.

FIG. 2b represents a similar contour diagram of the sensitive volume produced in the small coil 21, with the large coil 22 detuned. The complicated area close to the surface is the high flux region. At least a 270°, 450° and 630° signal regions can be discerned (30, 29 and 28 respectively).

FIG. 2c represents the image of the sensitive volume in the xy plane, which is produced for the same coil arrangement and sample, using a pulse sequence of the form [A].

$$[A] = 2\theta[\pm x]; \left(2 \times \frac{2\theta}{3} + \frac{4\theta}{3}\right); 2\theta[\pm x, \pm y] - \tau -$$

$$2\Phi[\pm x', \pm y'] - 2\tau - 2\Phi[\pm x', \pm y'] - \tau - \text{acquire with } \theta\text{coil.}$$

FIG. 2(d) is the image of the sensitive volume in the xz plane of the same sequence.

In experimental tests with one coil, the presence of the detuned second coil did not obviously change the Rf field distribution of the first coil. However, the detune switches 15 and 16 were not completely equivalent to opening the Rf circuits, as they shifted the tuning points to two points an equal distance either side of 32 MHz, (ie. to ±8 MHz and ±12 MHz for the large and small coil respectively). The switches 15 and 16 lowered the Q's of both coils by 40%, compared with the Q's measured for each coil when the detuned switches and the other coil is entirely removed from the probe. This reduction was mirrored by a 25% reduction in 90° pulse time (dependent upon Q$^{\frac{1}{2}}$) for each coil for a small phantom sample at a set point in the sample space, when the detune switches and the other coil is removed. The reduction in signal-to-noise ratio produced by this reduction in Q was too small to be measured accurately.

Cables external to an Rf probe can easily feed in external nose. This was prevented to optically coupling the external spectrometer pulse line to the reed relays and using a common earth for the λ/4 cables and the Faraday shielding around the Rf coils.

The reed relays employed (RS Components, Corby, England, type 7-RSR-A, operate time 2 msec maximum, release time 0.2 msec, breakdown voltage minimum 700 V d.c.) arced under Rf power for pulses longer than 1 msec, for a large range of Rf power levels. For the experiments carried out, this was not a problem, though it was determined that the arcing could be eliminated by inserting short delays (eg. 1 msec) between long pulses. The alternative of using λ/2 cables, with each coil tuned with the respective relay closed, was not employed because the relays induce a further loss of Q when part of the tuned circuit, because of their small contact resistance. However, this would eliminate the possibility of arcing and there are clearly gains to be had by seeking out better switches.

Complete localization of the sensitive volume has been demonstrated using this twin surface coil system and the detune switches, by applying the equivalent of the pulse scheme [A], mentioned above, wherein θ signifies pulses applied with the large coil 22, and Φ signifies pulses applied with the small coil Φ (see. M. R. Bendall, Chemical Physics Letters, 99, 310 (1983); and M. R. Bendall in "Biomedical Magnetic Resonance", A. R. Margulis and T. L. James, editors, Radiology Research and Education Foundation, San Francisco (1984); and M. R. Bendall, U.S. patent application Ser. No. 516,729.

Instead of laboriously mapping the sensitive volume with a small phantom sample, the sensitive volume was image at $^{31}$P frequencies using a slice phantom of H$_3$PO$_4$ and a standard procedure which, for a single coil, may be written schematically as

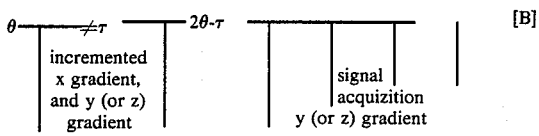

The y (or z) gradient after the first pulse is adjusted to ensure that the top of the spin-echo occurs at the end of the second τ period halfway through signal acquizition. The incremented x gradient provides the second image dimension via a second transformation, ie. the standard Fourier Transform imaging method.

Experiments were carried out using a prototype Biospec spectrometer and a 30 cm bore 1.9T magnet. Scheme [B] was used to reveal the shape of the sensitive volume for each coil (relay open) with the other coil detuned (relay closed) and the results for the large and small coil are shown in FIGS. 2(a) and (b) respectively for the xy plane. To test the rapidity of the detune switches, the experiment illustrated in FIG. 2(a) was repeated with the small coil tuned and the large coil detuned just before each transient. Reversing the switches 2.5 msec before the θ pulse in [B] led to the same image as in FIG. 2(a).

To test the complete double coil method, the field gradients as in scheme [B] were added to the last two $\tau$ periods of Scheme [A] and signal acquisition was moved forward 4 msec to encompass both the rise and decay of the spin echo. The phase-cycling for the refocusing pulse is unnecessary for a homogeneous phantom when using pulsed field gradients (eg. as in [B]) and an equivalent result was obtained by omitting the phase-cycling for the last $\Phi$ pulse in [A]. The detune switches were reversed by a software controlled external line immediately after the $2\theta[\pm x, \pm y']$ pulse and the last $2\Phi[\pm x', \pm y']$ pulse. The image of the sensitive volume is shown for the phantom slice in the xy and xz planes in FIGS. 2(c) and (d) respectively. FIG. 2(c) in comparison to (a) and (b) clearly shows that the sensitive volume corresponds to the overlap of the 90° signal regions of the separate coils. FIG. 2(d) confirms the result for the xz plane and demonstrates the expected smaller z dimension. The high flux regions for the small coil (FIG. 2(b)) overlap the 270° region for the large coil and the latter need to be eliminated using the procedure $(2 \times 2\theta/3 + 4\theta/3)$ as previously described in the publication cited above. This symbolism signifies the duplication of sequence [A] with the excitation pulse reduced to $2\Phi/3$ and then repeated for a third time with the pulse increased to $4\Phi/3$. Some small regions 31, 32, 33 of residual 270° signals are observable in FIG. 2(c) but they are 10% of the maximum intensity in the main sensitive volume, a reduction of 30 times from the original intensity as in FIG. 2(a).

The receive coil for these experiments was a broadband coil 23.

The foregoing experiments using a homogeneous phantom illustrate for the extreme case of two coils which would otherwise be tightly coupled that it is possible to detune, using a switching arrangement as described in FIG. 1. Indeed, by essentially eliminating the influence of an Rf coil, this method has advantages over the passive cross-diode procedure, which leaves the receive coil as a broadband coil during the Rf pulses.

Although this double surface coil method is a vast improvement over a single surface coil, one disadvantage is that the sensitive volume is curved. In general, it is desirable to be able to localize the volume from which signals are obtained to a region which is as nearly spherical as possible. This effect of curving in space can be decreased to some extent by utilizing as the transmit coils, instead of the coplanar coil arrangement described above, a coil assembly comprising two pairs of coils arranged in a "flower-petal" configuration.

Figure 3:
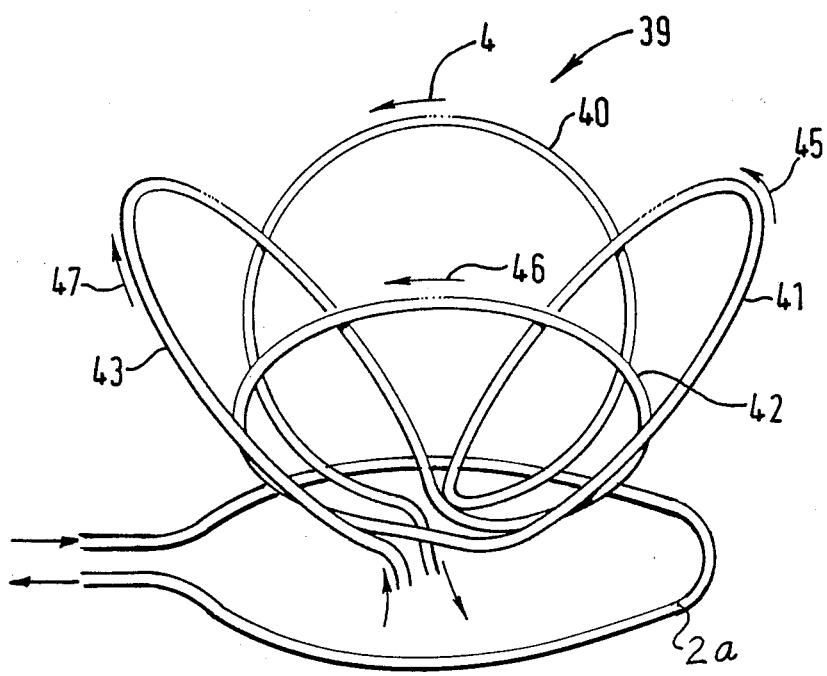
FIG. 3 is a schematic diagram of a coil assembly according to the invention.

A suitable coil arrangement is illustrated in FIG. 3, which comprises four loops, 40, 41, 42 and 43. The loops are connected at their base, so that the circuit is continuous, and so that for each pair of opposite loops, electric current flows in the same direction (ie. in the same direction about an axis passing through the pairs of opposite loops). Thus, the current in loops 40, 41, 42 and 43 flows in the direction shown by arrows 44, 45, 46 and 47 respectively. The opposite coils 40 and 42 are mutually at right angles, as are opposite coils 41 and 43. Similarly, an axis drawn through the center of coils 41 and 43 intersects an axis drawn through the center of coils 40 and 42 at right angles.

The coil assembly is utilized as the $\theta$ coil for a spectrometer probe 2a as described above. The $\Phi$ probe is disposed in a plane perpendicular to an axis passing through the "stem" of the flower.

Figure 4:
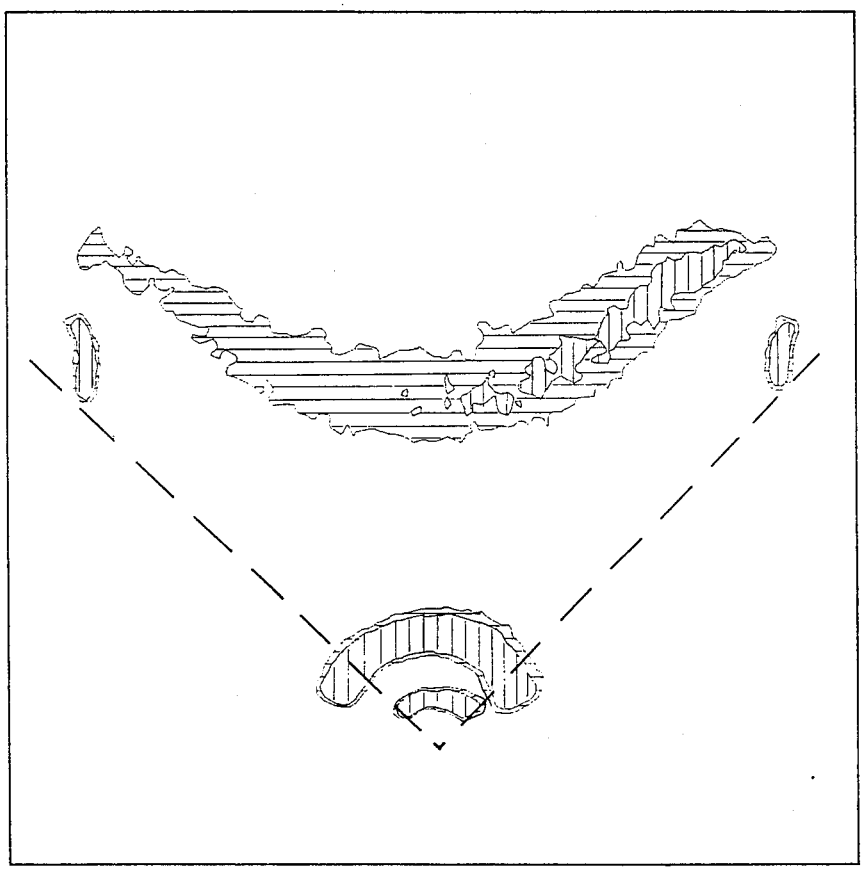
FIGS. 4 to 8 represent $^{31}P$ images obtained using a practical embodiment of the assembly of FIG. 3.
Figure 5:
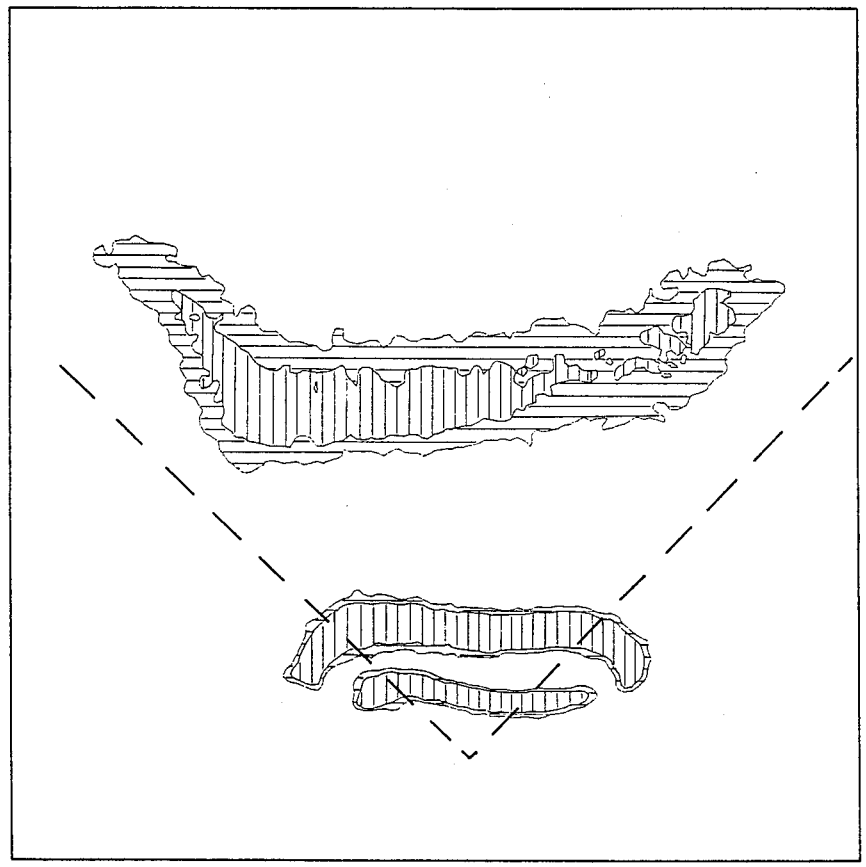
Figure 6:
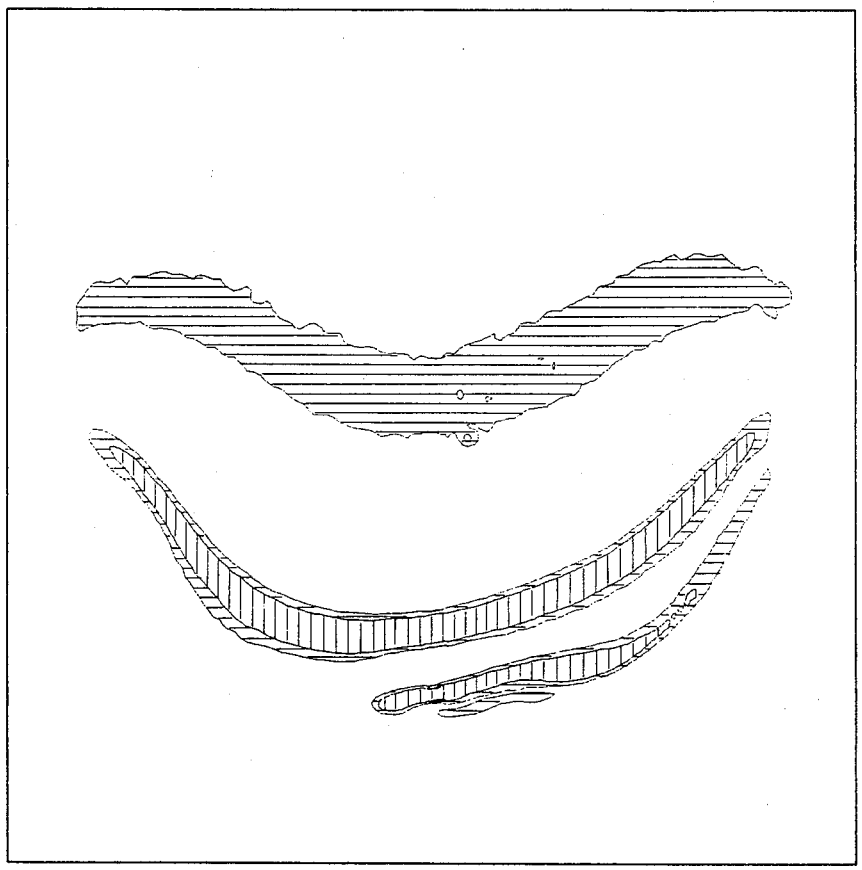
Figure 7:
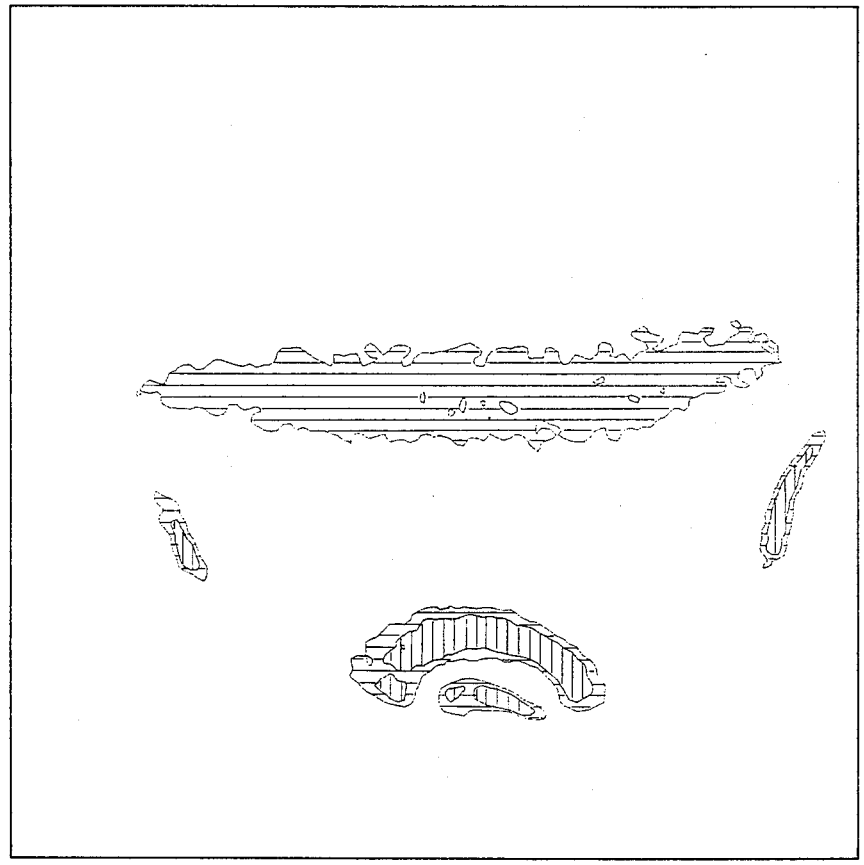

FIGS. 4 and 7 show $^{31}$P images of sensitive volume using a 1 cm thick circular slice phantom of $H_3PO_4$ of sufficient diameter to fit just inside the four coils 40, 41, 42, 43, whose diameters were 9 cm. The images were obtained using the depth pulse scheme $(2\theta[\pm x])_2; \theta; 2\theta[\pm x, \pm y];$ acquire [C]

using the terminology referred to above, modified by inserting pulsed field gradients before and after the last $2\theta$ pulse in the same way that scheme [A] was modified using the general method shown in scheme [B]. FIG. 4 is a contour diagram obtained for the slice phantom placed in the middle of the coil array in the xy plane, and FIG. 5 shows the equivalent image in the xz plane. FIGS. 6 and 7 show images for the two planes which contain the x axis, and are diagonal to y and z. Departure from symmetry (eg. as in FIG. 5) is thought to result from a failure to wind the coils 40 to 43 with perfect symmetry.

Figure 8:
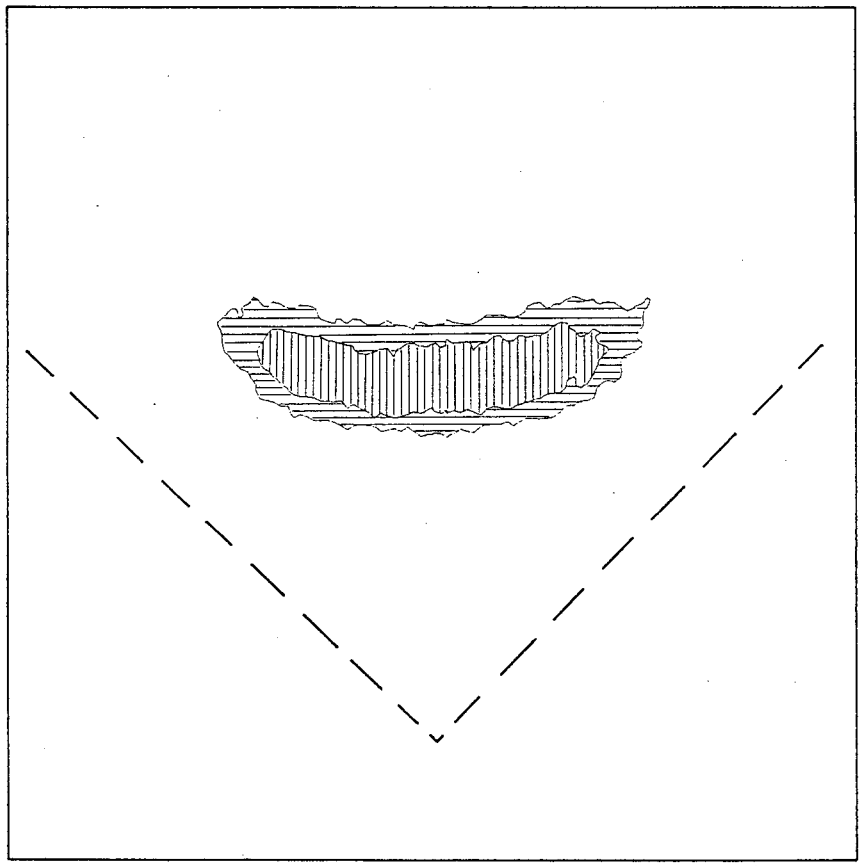

FIG. 8 shows the $^{31}$P images of the sensitive volume obtained for the circular slice phantom in the xy plane using the pulse scheme [A], modified to include the general method in [B]. The coil assembly 39 was used as the $\theta$ coil, and an additional surface coil as $\Phi$ coil. Such an arrangement would be suitable, for example, for performing NMR determinations on the human brain, without detecting the intervening skull. The apparatus and method according to the invention may also be utilized on other parts of the human body. In a further aspect of the invention, there is therefore provided apparatus for obtaining a spectrum of a living body, comprising means for producing a homogeneous magnetic field, and a pair of Rf coils, switching means associated with each of the Rf coils for connecting the coil to ground, whereby each of the said coils may be detuned, means for applying a sequence of pulses to at least one of the coils, and for operating the switching means in association therewith, to selectively detune one or other of the said coils. The apparatus according to the invention may preferably include a sample support, for example a support for a patient, to support the patient with a part of the body of the patient in the magnetic field.

Although in the embodiment described above, the opposed coils of the "flower petal" configuration are right angles to each other, angles greater than or less than a right angle maybe utilized. Furthermore, although, in the embodiment described, all four coils constituting the "petals" are wired in series, it would be possible for the two pairs of coils to be used separately as the $\theta$ and $\Phi$ coils respectively. Finally, although it is particularly preferred that the current in diametrically opposed coils should flow in the same direction (i.e. in the same direction about an axis passing through the coils), in certain circumstances, for example when one pair of coils is used as the $\theta$ set, and one as the $\Phi$, it may be advantageous to arrange for the current to flow in opposite directions in opposed coils.

It will be understood that, although the invention has been illustrated with reference to a particularly preferred embodiment, those skilled in the art will appreciate that changes in form and detail may be made within the scope of the appended claims.

We claim:

1. Apparatus for obtaining an N.M.R. spectrum of a sample, which apparatus comprises;
    means for generating a static magnetic field;

a sample location space within the magnetic field for containing the sample;

means for applying to the space an Rf field having a wavelength such as to cause perturbation of nuclear spins in the sample space in the presence of the magnetic field;

means for detecting the Rf signal induced in the sample as a consequence of the applied rf field, the apparatus comprising at least two tuned Rf coils, at least one of the said Rf coils being connected to ground via a selectively operable high speed switch, whereby operation of the switch causes the detuning of the said at least one coil and thereby the decoupling of the said coil from the said other coil; said apparatus further comprising processing means for controlling the high-speed switch to cause said detuning.

2. Apparatus as claimed in claim 1, wherein the switch includes a transmission line comprising a pair of elongate conductors having its conductors connected respectively to the said at least one coil and ground at one of its ends, and being provided with a switch at its other end, the transmission line having a length equivalent to an integral multiple of quarters of the said wavelength.

3. Apparatus as claimed in claim 2, wherein the transmission line is a length of coaxial cable.

4. Apparatus as claimed in claim 1, wherein at least two RF coils are provided with a high speed switch adapted to cause connection of the said coil to ground on operation, whereby operation of the respective switching means causes the detuning of the said respective coil.

5. Apparatus as claimed in claim 1 for obtaining an N.M.R. spectrum of a portion of a human body, comprising means for supporting the human body with the said portion of the human body in the sample space.

6. Apparatus as claimed in claim 1, including a coil assembly comprising at least two pairs of complimentary electrical coils, the coils of each pair being inclined with respect to each other in a 'flower-petal' configuration about an axis of symmetry, with coils corresponding to diametrically opposite petals connected together such that the same electrical current flows in diametrically opposed coils, and wherein said assembly further comprises an additional coil, said additional coil being disposed in a plane perpendicular to said axis of symmetry, and wherein all said coils arranged in the said 'flower petal' configuration are connected to ground via first switching means, and said additional coil is connected to ground via second switching means.

7. A coil assembly for use in an N.M.R. spectrometer, comprising at least two pairs of complimentary electrical coils, the coils of each pair being inclined with respect to each other in a 'flower-petal' configuration about an axis of symmetry, with coils corresponding to diametrically opposite petals connected together such that the same electrical current flows in diametrically opposed coils, and wherein the assembly further comprises an additional coil, said additional coil being disposed in a plane substantially perpendicular to said axis of symmetry.

8. A coil assembly as claimed in claim 7, wherein coils of the assembly corresponding to diametrically opposed petals are connected such that electrical current flows in the same direction about an axis passing through the diametrically opposed coils.

9. A coil assembly as claimed in claim 8, wherein the number of pairs of coils is two.

10. A coil assembly as claimed in claim 9, wherein the axes of the said coil pairs are substantially at right angles to each other.

11. A coil assembly as claimed in claim 8, wherein the two coils of each pair are substantially at right angles to each other.

* * * * *